United States Patent
Yamamoto et al.

(10) Patent No.: US 10,056,175 B2
(45) Date of Patent: Aug. 21, 2018

(54) THERMISTOR MOUNTING APPARATUS AND THERMISTOR COMPONENT

(71) Applicant: FUJI ELECTRIC CO., LTD., Kanagawa (JP)

(72) Inventors: Sayaka Yamamoto, Matsumoto (JP); Shogo Ogawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/150,432

(22) Filed: May 10, 2016

(65) Prior Publication Data

US 2016/0360620 A1 Dec. 8, 2016

(30) Foreign Application Priority Data

Jun. 4, 2015 (JP) .................. 2015-114191

(51) Int. Cl.
*H01C 7/10* (2006.01)
*H01C 7/00* (2006.01)
*H01C 1/012* (2006.01)
*H05K 1/02* (2006.01)
*H05K 1/14* (2006.01)

(52) U.S. Cl.
CPC ............. *H01C 7/008* (2013.01); *H01C 1/012* (2013.01); *H05K 1/0201* (2013.01); *H05K 1/0268* (2013.01); *H05K 1/141* (2013.01); *H05K 2201/049* (2013.01); *H05K 2201/10022* (2013.01)

(58) Field of Classification Search
CPC ................................ H01C 7/008; H01C 1/012
USPC ................................................. 338/22 R, 13
See application file for complete search history.

(56) References Cited

U.S. PATENT DOCUMENTS

| | | | |
|---|---|---|---|
| 6,960,980 B2* | 11/2005 | Nakatsu | H02M 7/003 323/367 |
| 7,173,512 B2* | 2/2007 | Ko | H01C 7/008 338/22 R |
| 2011/0261536 A1* | 10/2011 | Feichtinger | H01C 1/084 361/713 |
| 2013/0328153 A1* | 12/2013 | Miura | H01C 1/014 257/467 |

FOREIGN PATENT DOCUMENTS

JP 2011-86821 A 4/2011

* cited by examiner

*Primary Examiner* — Kyung Lee

(57) ABSTRACT

In order to realize a thermistor on a base substrate without restricting the layout of a wiring layer, a thermistor mounting apparatus is provided, the thermistor mounting apparatus including a base substrate, and a thermistor component provided over the base substrate, in which the thermistor component has an insulating substrate, an electrode provided over the insulating substrate, and a thermistor provided over the insulating substrate and electrically connected to the electrode.

12 Claims, 6 Drawing Sheets

THERMISTOR MOUNTING APPARATUS AND THERMISTOR COMPONENT

The contents of the following Japanese patent application(s) are incorporated herein by reference: No. 2015-114191 filed on Jun. 4, 2015.

BACKGROUND

1. Technical Field

The present invention relates to a thermistor mounting apparatus and a thermistor component.

2. Related Art

An apparatus is conventionally known in which a substrate provided with an electronic component such as a semiconductor chip or the like is further provided with a thermistor (refer to, for example, Patent Document 1).

PRIOR ART DOCUMENT

Patent Document 1: Japanese Patent Application Publication 2011-86821

A wiring layer on a substrate, which is connected to an electronic component, must be electrically insulated from an electrode on the substrate, which is connected to a thermistor. Therefore, in a case where the electronic component and the thermistor are provided on the same substrate, the layout of the wiring layer is restricted.

SUMMARY

In a first aspect of the present invention, a thermistor mounting apparatus is provided, the thermistor mounting apparatus including a base substrate, an insulating substrate provided over the base substrate, an electrode provided over the insulating substrate, and a thermistor provided over the insulating substrate and electrically connected to the electrode.

In a second aspect of the present invention, a thermistor mounting apparatus is provided, the thermistor mounting apparatus including a base substrate, a wiring layer provided over the base substrate, an insulating substrate provided over the wiring layer, an electrode provided over the insulating substrate, and a thermistor provided over the insulating substrate and electrically connected to the electrode.

In a third aspect of the present invention, a thermistor component is provided, the thermistor component including an insulating substrate, an electrode provided over the insulating substrate, a thermistor provided over the insulating substrate and electrically connected to the electrode, and an adhering layer provided under the insulating substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential in means provided by aspects of the invention.

Figure 1A:
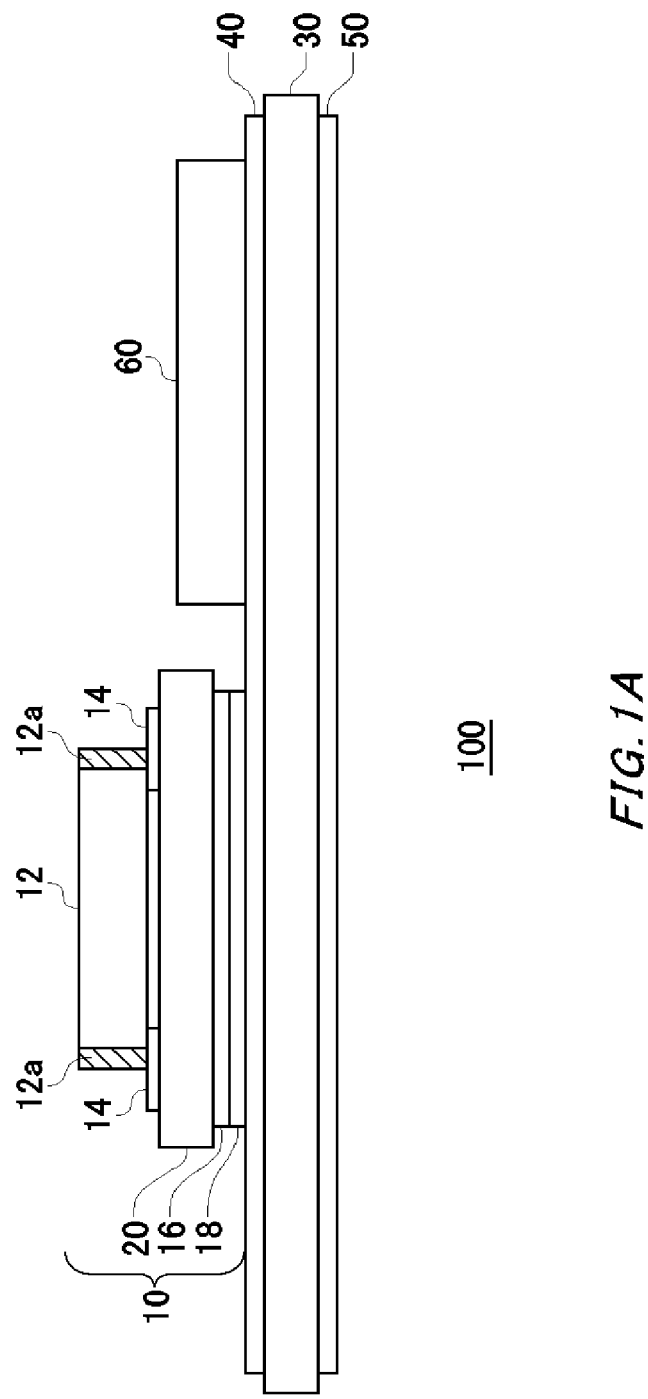
FIG. 1A is a cross-sectional view showing an example of a thermistor mounting apparatus 100 according to an embodiment of the present invention.
Figure 1B:
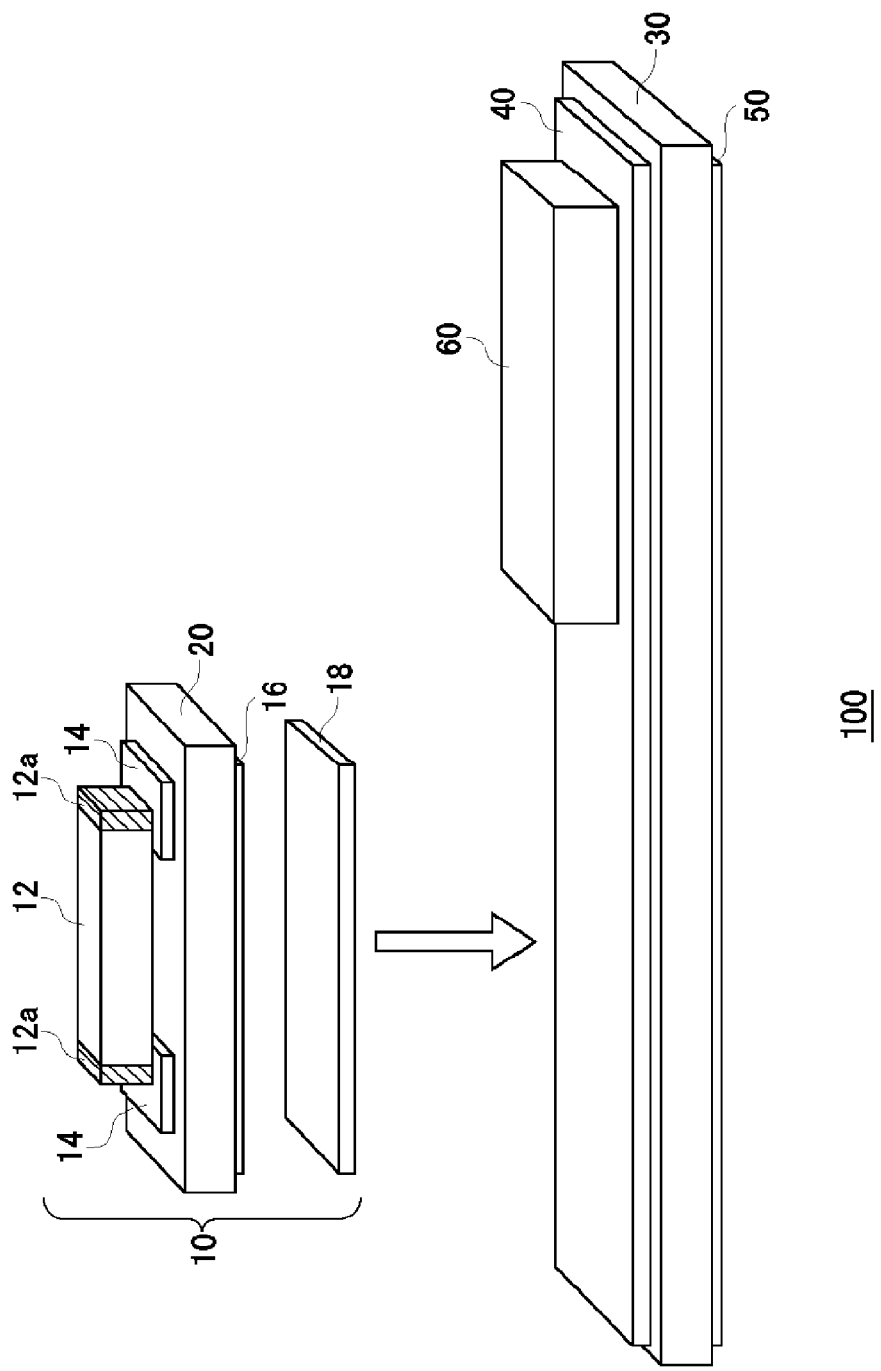
FIG. 1B is a perspective view showing an outline of the thermistor mounting apparatus 100.

FIG. 1A is a cross-sectional view showing an example of a thermistor mounting apparatus 100 according to an embodiment of the present invention. FIG. 1B is a perspective view showing an outline of the thermistor mounting apparatus 100. The thermistor mounting apparatus 100 is provided with a thermistor 12 on a base substrate 30. The thermistor mounting apparatus 100 of the present embodiment includes a thermistor component 10 and the base substrate 30. The thermistor component 10 has an insulating substrate 20, electrodes 14, and the thermistor 12. The thermistor mounting apparatus 100 of the present embodiment further includes an electronic component 60, a wiring layer 40, and a heat radiating portion 50.

The base substrate 30 is an insulating substrate such as, for example, a ceramic substrate, a resin substrate, and the like. Alternatively, the base substrate 30 may be a metal substrate constituted of copper, aluminum, or the like. In a case where the base substrate 30 is a metal substrate, the thermistor mounting apparatus 100 can omit the heat radiating portion 50. Moreover, in a case where the base substrate 30 is a metal substrate, the thermistor mounting apparatus 100 further includes an insulating layer between the wiring layer 40 and the base substrate 30 to electrically insulate the wiring layer 40 and the base substrate 30.

The heat radiating portion 50 is provided under the base substrate 30. The heat radiating portion 50 of the present embodiment is arranged in contact with the lower surface of the base substrate 30. The lower surface of the base substrate 30 refers to one of two main surfaces of the base substrate 30. The heat radiating portion 50 is constituted of a material having thermal conductivity higher than that of the base substrate 30. The heat radiating portion 50 of the present embodiment is formed on the entire lower surface of the base substrate 30. As an example, the base substrate 30 is a ceramic substrate, and the heat radiating portion 50 is a copper plate. The heat radiating portion 50 of the present embodiment is bonded to, for example, the base substrate 30 by a DCB (Direct Copper Bond) method.

The thermistor component 10 is provided over the base substrate 30. In the thermistor mounting apparatus 100 of the present embodiment, the wiring layer 40 is arranged between the thermistor component 10 and the base substrate 30. The wiring layer 40 of the present embodiment is arranged in contact with the upper surface of the base substrate 30. The upper surface of the base substrate 30 refers to a surface on the opposite side of the above-mentioned lower surface out of the two main surfaces of the base substrate 30.

The wiring layer 40 electrically connects the electronic component 60 and other components other than the thermistor component 10. The electronic component 60 and the thermistor component 10 are secured to the upper surface of the wiring layer 40 of the present embodiment. The wiring layer 40 is formed of a conductive material. The wiring layer 40 of the present embodiment is a copper plate, and is bonded to the base substrate 30 by the DCB method. The wiring layer 40 may be obtained by patterning a conductive layer in a predetermined shape.

The thermistor component 10 is secured to the upper surface of the wiring layer 40. The thermistor component 10 has the thermistor 12, the insulating substrate 20, and the electrodes 14. The thermistor 12 is electrically insulated from the wiring layer 40 by the insulating substrate 20. The thermistor component 10 of the present embodiment further has a thermal conductive layer 16 and an adhesive layer 18.

The insulating substrate 20 is constituted of, for example, an insulating material such as ceramic, resin, or the like. The insulating substrate 20 is provided over the base substrate 30. An area of the insulating substrate 20 is smaller than the area of the base substrate 30. Moreover, the area of the insulating substrate 20 is smaller than an area of the wiring layer 40. More specifically, the area of the insulating substrate 20 is smaller than a region of the upper surface of the wiring layer 40 other than the region where the electronic component 60 is provided.

This allows the thermistor component 10 to be installed in a region different from the electronic component 60 on the upper surface of the base substrate 30. For example, the area of the insulating substrate 20 is no greater than half of the area of the base substrate 30. Moreover, the insulating substrate 20 has a thickness capable of assuring insulation between the wiring layer 40 and the thermistor 12. As an example, the insulating substrate 20 has a thickness identical to that of the base substrate 30.

The thermal conductive layer 16 is provided between the insulating substrate 20 and the base substrate 30. Moreover, the thermal conductive layer 16 is formed of a material having thermal conductivity higher than that of the insulating substrate 20. In the present embodiment, the thermal conductive layer 16 is constituted of copper, and the insulating substrate 20 is constituted of ceramic. The thermal conductive layer 16 of the present embodiment is bonded to the insulating substrate 20 by the DCB method. In the present embodiment, an area of the thermal conductive layer 16 is substantially identical to the area of the insulating substrate 20.

The adhesive layer 18 is provided between the thermal conductive layer 16 and the base substrate 30. The adhesive layer 18 of the present embodiment secures the lower surface of the thermal conductive layer 16 to the upper surface of the wiring layer 40. The thermal conductive layer 16 is constituted of a material in which adhesive properties of the thermal conductive layer 16 to the adhesive layer 18 are higher than adhesive properties of the insulating substrate 20 to the adhesive layer 18. The phrase "adhesive properties . . . higher" means that in a case where a force is applied in a direction where the base substrate 30 and the insulating substrate 20 separate from each other, the force to be generated when the base substrate 30 and the insulating substrate 20 start to separate is greater. In the present embodiment, for example, the adhesive layer 18 is constituted by solder.

The electrodes 14 are provided over the insulating substrate 20. In the present embodiment, two electrodes 14 are arranged in contact with the upper surface of the insulating substrate 20. The two electrodes 14 are provided separating from each other within a region opposite to the thermal conductive layer 16. The distance between the two electrodes 14 is substantially the same as the length of the thermistor 12. It is preferable that the insulating substrate 20 is as small as possible to the extent that the two electrodes 14 can be provided thereon. For example, in an array direction where the two electrodes 14 are disposed, the distance between an end of each electrode 14 and an edge of the insulating substrate 20 is shorter than a width of each electrode 14.

The thermistor 12 is provided over the insulating substrate 20 and electrically connected to the electrodes 14. The thermistor 12 of the present embodiment has two terminals 12a electrically connected to the respective two electrodes 14. The thermistor 12 has a resistor portion between the two terminals 12a, in which electric resistance changes depending on temperature. Although FIGS. 1A and 1B schematically show a structure in which there is a space between that resistor portion and the insulating substrate 20, at least a part of the resistor portion may be in contact with the insulating substrate 20.

The electronic component 60 is provided in a region different from the insulating substrate 20 over the base substrate 30. The electronic component 60 of the present embodiment is secured to a region different from the insulating substrate 20 on the upper surface of the wiring layer 40. The electronic component 60 is provided in a position which is at only a predetermined distance away from the thermistor component 10 so as to maintain electrical insulation against the thermistor 12. In the present embodiment, the electronic component 60 is a power semiconductor chip such as IGBT (Insulated Gate Bipolar Transistor), power MOSFET, or the like, to which a high voltage is applied.

According to the thermistor mounting apparatus 100 in the present embodiment, the electronic component 60 and the thermistor component 10 can be provided on the same base substrate 30. Moreover, since the thermistor component 10 includes the insulating substrate 20, the thermistor component 10 can be provided in contact with the wiring layer 40. For this reason, the wiring layer 40 does not have to be laid out so as to avoid the thermistor component 10, thereby improving the degree of freedom in the layout of the wiring layer 40.

Moreover, since it is not necessary to reserve a region for routing the wiring layer 40 so as to avoid the thermistor component 10, the base substrate 30 can be miniaturized, and the thermistor mounting apparatus 100 can be miniaturized. Similarly, since a region where the electronic component 60 is provided can be widened, the electronic component 60 of large size can be easily mounted.

As shown in FIG. 1B, it is preferable that the thermistor 12 is secured to the insulating substrate 20, and the thermistor component 10 is then secured to the base substrate 30. In the present embodiment, the thermal conductive layer 16, the two electrodes 14, and the thermistor 12 are secured to the insulating substrate 20, and the thermistor component 10 is then secured to the wiring layer 40. That is, a finished thermistor component 10 is secured to the base substrate 30. As an example, although the adhesive layer 18 is provided on the thermistor component 10 side, the adhesive layer 18 may also be provided on the base substrate 30 side.

Further, the electronic component 60 is also secured to the wiring layer 40 using solder, or the like. As an example, the electronic component 60 and the thermistor 10 are secured to the wiring layer 40 in the same reflow step. In another example, the thermistor component 10 may be secured to the wiring layer 40 after the arrangement of the thermistor component 60, or the electronic component 60 may be secured to the wiring layer 40 after the arrangement of the thermistor component 10.

Figure 2:
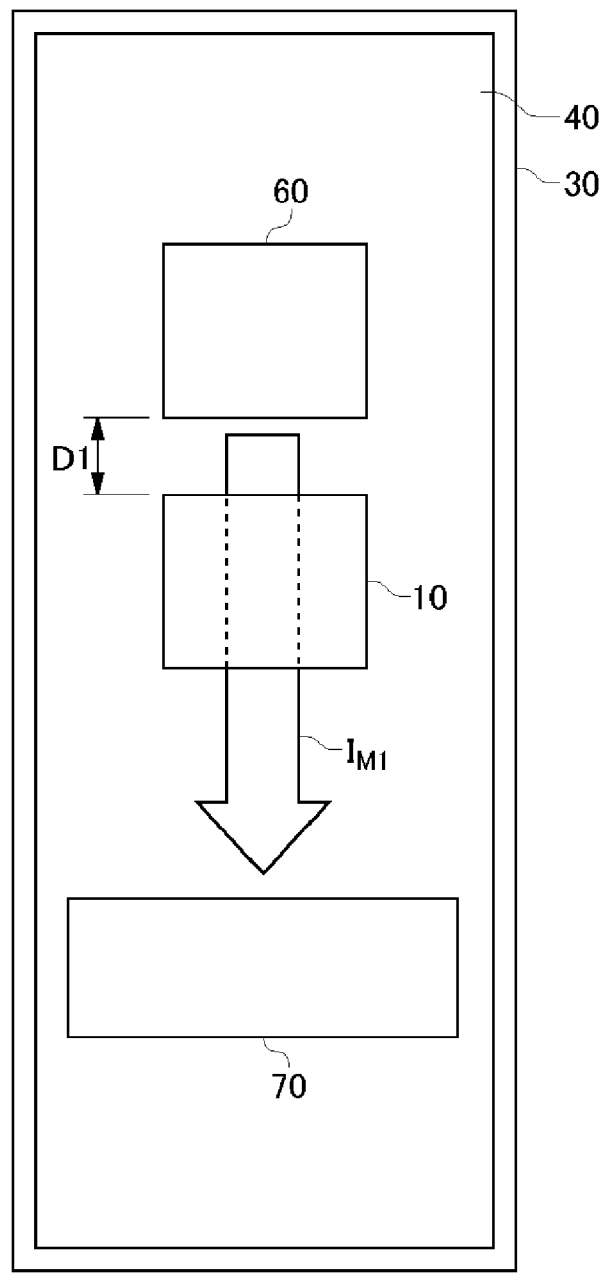
FIG. 2 is a top plan view showing an example of the thermistor mounting apparatus 100.

FIG. 2 is a top plan view showing an example of the thermistor mounting apparatus 100. The thermistor mounting apparatus 100 of the present embodiment further has an electrode 70 for the thermistor mounting apparatus 100 shown in FIGS. 1A and 1B. The electrode 70 is electrically connected to the outside of the thermistor mounting apparatus 100 through a wire, a lead, a pin, or the like.

The electrode 70 is bonded to the wiring layer 40. The electronic component 60 and the electrode 70 are thereby electrically connected via the wiring layer 40. In the present embodiment, a current $I_{M1}$ flows from the electronic component 60 to the electrode 70.

In the present example, the thermistor component 10 is arranged between the electronic component 60 and the electrode 70 on the wiring layer 40. Since the thermistor component 10 has the insulating substrate 20, the thermistor component 10 can be installed on the electrode 70. Moreover, the temperature of the electronic component 60 which performs operations while flowing the current $I_{M1}$ can be measured using the thermistor component 10 arranged in its proximity.

Figure 3:
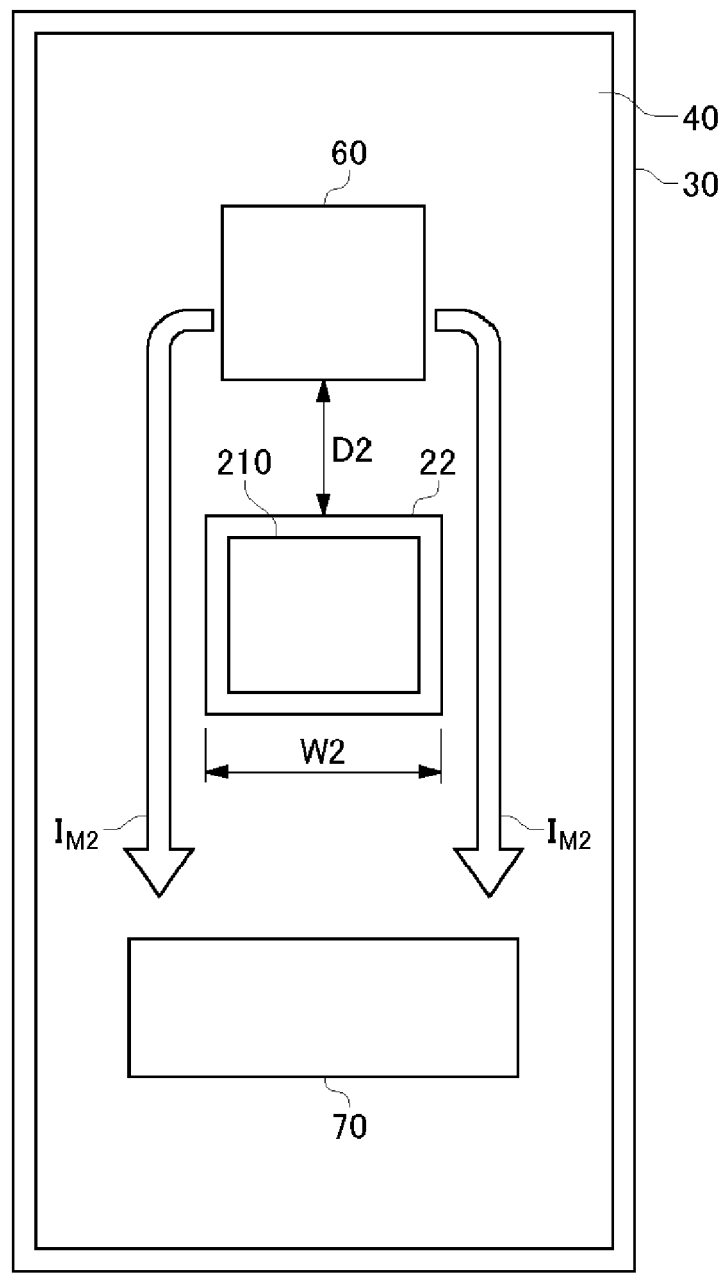
FIG. 3 is a top plan view showing an example of a thermistor mounting apparatus 200 as a comparative example.

FIG. 3 is a top plan view showing an example of the thermistor mounting apparatus 200 as a comparative example. A thermistor component 210 in the thermistor mounting apparatus 200 does not have the insulating substrate 20. For example, the thermistor component 210 directly secures the electrode 14 and the thermistor 12 to the base substrate 30. In this case, the wiring layer 40 has an opening 22 from which the conductive material is removed in a region where the thermistor component 210 is provided.

Since the thermistor component 10 in the example of FIG. 2 has the insulating substrate 20, the thermistor component 10 has insulating properties higher than those of the thermistor component 210 in the example of FIG. 3. For this reason, even if a distance D1 between the thermistor component 10 and the electronic component 60 is made shorter than a distance D2 between the thermistor component 210 and the electronic component 60, insulation can be assured between the thermistor component 10 and the electronic component 60. Therefore, the thermistor mounting apparatus 100 can be miniaturized. Furthermore, since the distance between the electronic component 60 and the thermistor 12 can be made shorter, the temperature of the electronic component 60 can be measured more accurately.

Moreover, since the wiring layer 40 has the opening 22 in the example of FIG. 3, a current $I_{M2}$ flowing from the electronic component 60 to the electrode 70 flows by bypassing the opening 22. For this reason, the wiring layer 40 is required to have a width allowing the current $I_{M2}$ to flow at low resistance, in addition to a width W2 of the opening 22. Meanwhile, since the current $I_{M1}$ can pass below the thermistor component 10, the thermistor mounting apparatus 100 shown in FIG. 2 has less restriction on the layout of the wiring layer 40. For example, a width of the wiring layer 40 of the thermistor mounting apparatus 100 can be reduced compared to that of the thermistor mounting apparatus 200, and thus the thermistor mounting apparatus 100 can be miniaturized.

Figure 4:
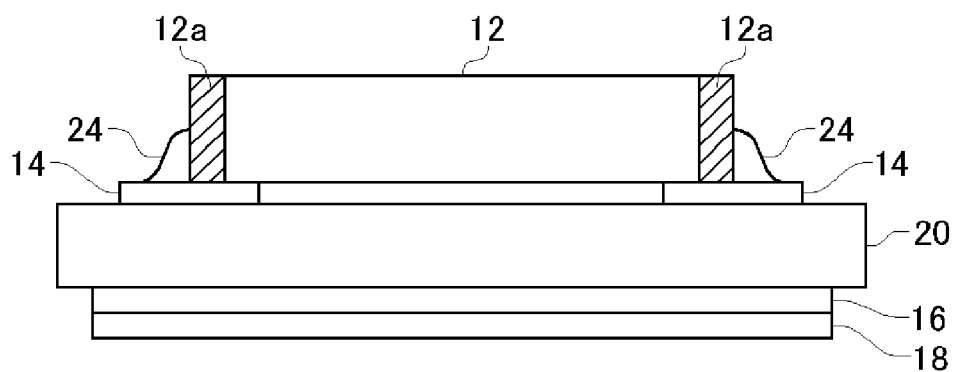
FIG. 4 is a cross-sectional view showing a structural example of a thermistor component 10.

FIG. 4 is a cross-sectional view showing a configurational example of the thermistor component 10. The thermistor component 10 shown in FIG. 4 further has a securing portion 24, in addition to the configuration of the thermistor component 10 shown in FIGS. 1A and 1B.

The securing portion 24 secures the thermistor 12 to the electrodes 14. The securing portion 24 is constituted of a material having a melting point higher than that of the adhesive layer 18. For example, the securing portion 24 is a metal sintered material, and the adhesive layer 18 is solder containing tin. The securing portion 24 may also be solder. In this case, the composition of materials such as tin, copper, silver, or the like contained in the solder has only to be adjusted to make the melting point of the securing portion 24 higher than the melting point of the adhering layer 18. By making such a constitution, the connection can be rigidly maintained between the thermistor 12 and the electrodes 14 even if the adhesive layer 18 is heated to secure the finished thermistor component 10 to the wiring layer 40. The thermistor component 10 may also have the adhesive layer 18. For this reason, the thermistor component 10 can be easily secured to any position on the wiring layer 40.

Figure 5:
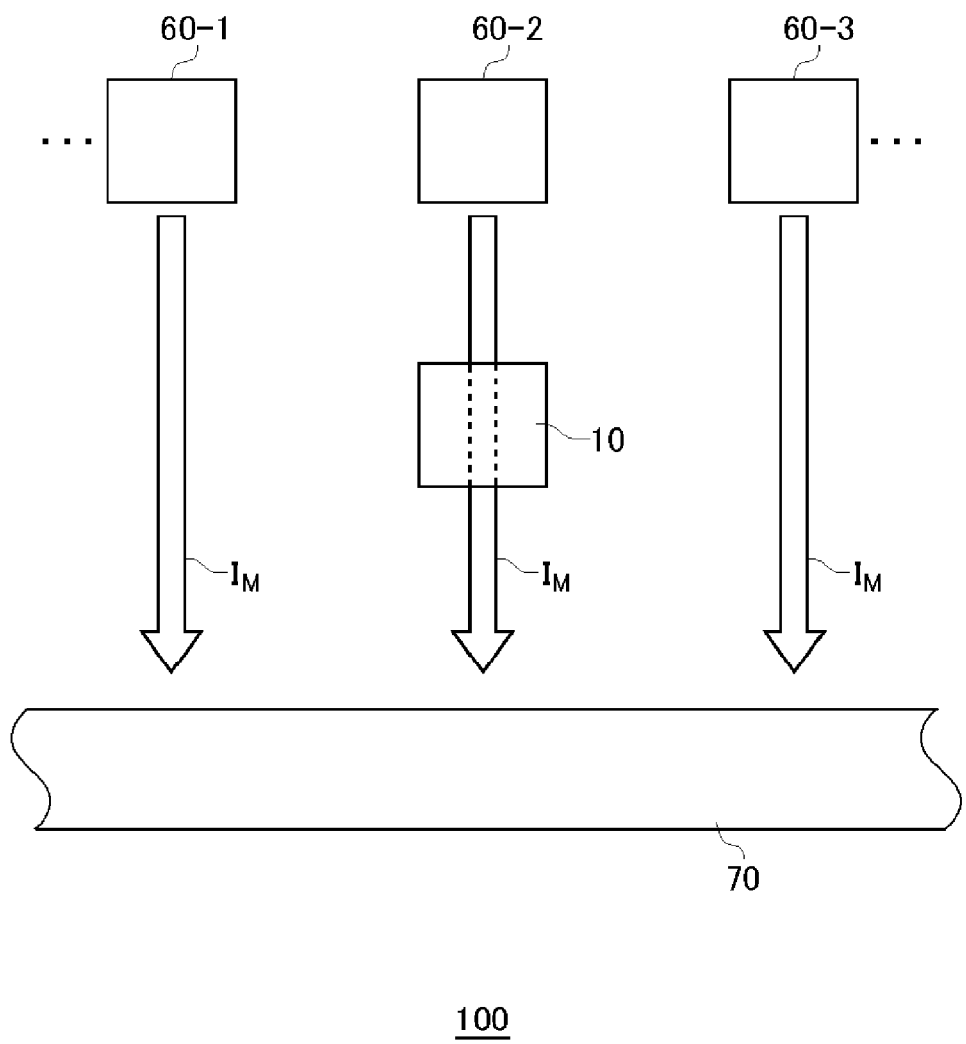
FIG. 5 is a top plan view showing another example of the thermistor mounting apparatus 100.

FIG. 5 is a top plan view showing another example of the thermistor mounting apparatus 100. However, the base substrate 30 and the wiring layer 40 are omitted in FIG. 5. The thermistor mounting apparatus 100 of the present embodiment has a plurality of electronic components 60. FIG. 5 shows three pieces of electronic components 60-1, 60-2, 60-3. The electronic components 60 of the present embodiment are semiconductor chips having the same characteristics and being provided in parallel. The "same characteristics" do not mean the very same characteristics in the strict sense. Even if there are differences in characteristics due to the manufacturing variations, such differences would be included in the concept of the above-mentioned "same characteristics."

The thermistor mounting apparatus 100 has the electrode 70 provided opposite to the respective electronic component 60. Although the electrode 70 shown in FIG. 5 is provided in common with the respective electronic component 60, the electrode 70 may also be provided for each electronic component 60.

The thermistor component 10 is provided corresponding to a part of the electronic components 60 among the plurality of electronic components 60. In the present embodiment, the thermistor component 10 is provided corresponding to the electronic component 60-2, meanwhile other electronic components 60-1, 60-3 are not provided with the thermistor component 10. For example, although the thermistor component 10 is provided on a straight line connecting the electronic component 60-2 and the electrode 70 at the shortest distance, no thermistor component 10 is provided on straight lines connecting other electronic components 60 and the electrode 70 at the shortest distance.

Since the thermistor component 10 has the insulating substrate 20, the current $I_M$ flowing between the electronic component 60 and the electrode 70 is not affected even if the thermistor component 10 is provided on the wiring layer 40. For this reason, even if the thermistor component 10 is provided corresponding to only a part of the electronic components 60 among the plurality of electronic components 60 having the same characteristics and being provided in parallel, characteristics variations among the electronic components 60 do not increase. For this reason, the current does not concentrate on the specific electronic component 60 even if only a part of the electronic components 60 is provided with the thermistor component 10.

In particular, in a case where the electronic components 60 are power semiconductor chips such as IGBT or the like, failures easily occur in the electronic components 60 when the current concentrates on the specific electronic component 60. In the thermistor mounting apparatus 100 of the present embodiment, the current does not concentrate even if only a part of the electronic components 60 is provided with the thermistor component 10, and thus the freedom degree in the arrangement of the thermistor component 10 can be improved.

The expressions of a pair of "on" and "over" and a pair of "below" and "under" in the claims and the specification mutually refer to opposite directions. However, the terms "on" and "over" are not limited to a direction opposite to the gravity direction. Moreover, the terms "below" and "under" are not limited to a direction of the gravity direction. For example, with regard to the thermistor mounting apparatus 100 implemented in the electronic equipment, it is apparent that the thermistor mounting apparatus 100 may be included in the present invention even if the thermistor component 10 is arranged on the ground surface side of the base substrate 30.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

DESCRIPTION OF REFERENCE NUMERALS

10 . . . thermistor component, 12 . . . thermistor, 14 . . . electrode, 16 . . . thermal conductive layer, 18 . . . adhesive layer, 20 . . . insulating substrate, 22 . . . opening, 24 . . . securing portion, 30 . . . base substrate, 40 . . . wiring layer, 50 . . . heat radiating portion, 60 . . . electronic component, 70 . . . electrode, 100 . . . thermistor mounting apparatus, 200 . . . thermistor mounting apparatus, 210 . . . thermistor component

What is claimed is:
1. A thermistor mounting apparatus, comprising:
a base substrate; and
a thermistor component provided over the base substrate, the thermistor component having:
an insulating substrate;
an electrode provided over the insulating substrate; and
a thermistor provided over the insulating substrate and electrically connected to the electrode,
wherein a wiring layer is formed on the base substrate, and the insulating substrate is adhered on top of the wiring layer such that the insulating substrate is between the thermistor with the electrode, and the wiring layer.
2. The thermistor mounting apparatus according to claim 1, further comprising an electronic component provided in a region different from the thermistor component over the base substrate.
3. The thermistor mounting apparatus according to claim 2, wherein the electronic component is provided in a region different from the thermistor component over the wiring layer.
4. The thermistor mounting apparatus according to claim 2, further comprising a plurality of the electronic components, wherein the thermistor component is provided corresponding to a part of one of the plurality of the electronic components.
5. The thermistor mounting apparatus according to claim 1, wherein an area of the insulating substrate of the thermistor component is smaller than an area of the base substrate.
6. A thermistor mounting apparatus comprising:
a base substrate; and
a thermistor component provided over the base substrate, the thermistor component having:
an insulating substrate;
an electrode provided over the insulating substrate; and
a thermistor provided over the insulating substrate and electrically connected to the electrode;
wherein the thermistor component further has a thermal conductive layer that is provided between the insulating substrate and the base substrate, the thermal conductive layer having thermal conductivity higher than that of the insulating substrate.
7. The thermistor mounting apparatus according to claim 6, wherein the thermistor component further has an adhesive layer provided between the thermal conductive layer and the base substrate, and adhesive properties of the thermal conductive layer to the adhesive layer are higher than adhesive properties of the insulating substrate to the adhesive layer.
8. The thermistor mounting apparatus according to claim 7, wherein the thermistor component is constituted of a material having a melting point higher than that of the adhesive layer, and further has a securing portion for securing the thermistor to the electrode.
9. A thermistor mounting apparatus, comprising:
a base substrate;
a wiring layer provided over the base substrate; and
a thermistor component provided over the wiring layer, the thermistor component having:
an insulating substrate;
an electrode provided over the insulating substrate; and
a thermistor provided over the insulating substrate and electrically connected to the electrode,
wherein the insulating substrate is adhered on top of the wiring layer such that the insulating substrate is between the thermistor with the electrode, and the wiring layer.
10. A thermistor component, comprising:
an insulating substrate;
an electrode provided over the insulating substrate;
a thermistor provided over the insulating substrate and electrically connected to the electrode; and
an adhesive layer provided under the insulating substrate,
wherein a wiring layer is formed on a base substrate, and the insulating substrate is adhered on top of the wiring layer such that the insulating substrate is between the thermistor with the electrode, and the wiring layer.
11. The thermistor component according to claim 10, further comprising a securing portion being formed of a material having a melting point higher than that of the adhesive layer, and securing the thermistor to the electrode.
12. The thermistor component according to claim 10, further comprising a thermal conductive layer being provided between the adhesive layer and the insulating substrate, and having thermal conductivity higher than that of the insulating substrate.

* * * * *